(12) United States Patent
Liu et al.

(10) Patent No.: US 11,037,921 B2
(45) Date of Patent: Jun. 15, 2021

(54) OFF CHIP DRIVER STRUCTURE

(71) Applicant: NANYA TECHNOLOGY CORPORATION, New Taipei (TW)

(72) Inventors: Fang-Wen Liu, New Taipei (TW); Tseng-Fu Lu, New Taipei (TW)

(73) Assignee: NANYA TECHNOLOGY CORPORATION, New Taipei (TW)

(*) Notice: Subject to any disclaimer, the term of this patent is extended or adjusted under 35 U.S.C. 154(b) by 0 days.

(21) Appl. No.: 16/653,979

(22) Filed: Oct. 15, 2019

(65) Prior Publication Data
US 2021/0111173 A1    Apr. 15, 2021

(51) Int. Cl.
*H01L 27/02*    (2006.01)
*H01L 27/07*    (2006.01)

(52) U.S. Cl.
CPC ...... *H01L 27/0255* (2013.01); *H01L 27/0288* (2013.01); *H01L 27/0727* (2013.01)

(58) Field of Classification Search
CPC ............. H01L 27/0266; H01L 27/0629; H01L 27/0727; H01L 27/0288
See application file for complete search history.

(56) References Cited

U.S. PATENT DOCUMENTS

| | | | | |
|---|---|---|---|---|
| 5,548,134 A | * | 8/1996 | Tailliet | H01L 27/0259 257/111 |
| 6,645,803 B1 | * | 11/2003 | Kalnitsky | H01C 17/26 257/E21.004 |
| 7,148,721 B2 | | 12/2006 | Park | |
| 7,981,753 B1 | | 7/2011 | O et al. | |
| 2015/0311192 A1 | | 10/2015 | Lin et al. | |

OTHER PUBLICATIONS

Chih-Ting Yei et al., "Study of intrinsic characteristics of ESD protection diodes for high-speed I/O applications", Microelectronics Reliability 52, Dec. 26, 2011, 1020-1030.
K. Chatty, "Study of factors limiting ESD Diode Performance in 90nm CMOS Technologues and Beyond", 2005 IEEE International Reliability Physics Symposium, 2005. Proceedings. 43rd Annual, Aug. 5, 2005.

* cited by examiner

*Primary Examiner* — John A Bodnar
(74) *Attorney, Agent, or Firm* — CKC & Partners Co., LLC

(57) ABSTRACT

An off chip driver structure includes a plurality of pull-up transistors, a plurality of pull-down transistors, a plurality of first regions of a first type, a plurality of second regions of a second type and a plurality of resistor components. The first regions and the second regions are staggered to form an electrostatic discharge (ESD) component. One of the resistor components is coupled to one of the pull-up transistors or one of the pull-down transistors, the resistor components are arranged between the first regions and the second regions.

10 Claims, 6 Drawing Sheets

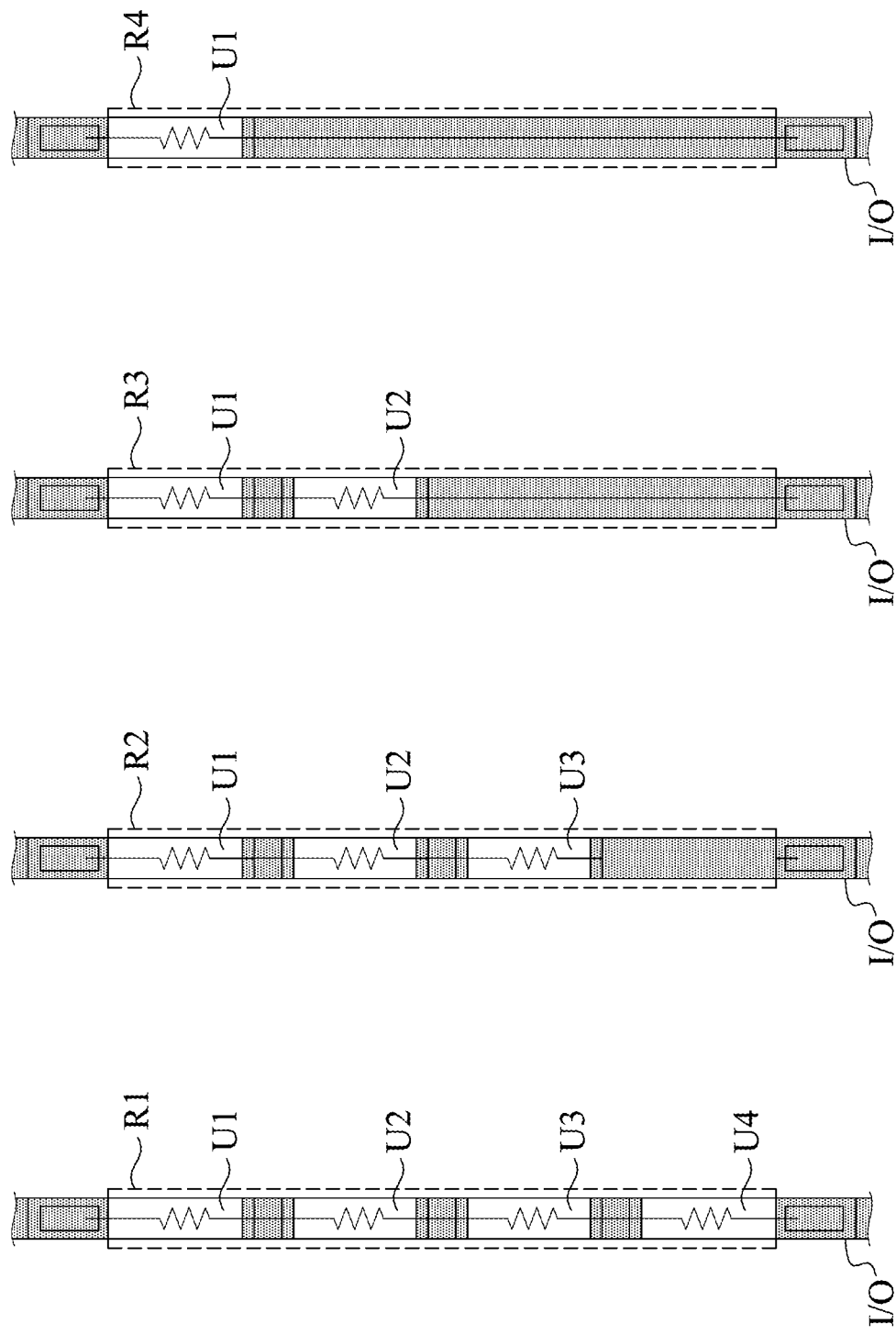

OFF CHIP DRIVER STRUCTURE

BACKGROUND

Technical Field

The disclosure relates to an off chip driver structure, particularly to an off chip driver structure with an electrostatic discharge (ESD) circuit.

Description of Related Art

In general input/output (I/O) pad design, the electrostatic discharge (ESD) protection circuit and off chip driver (OCD) circuit are usually placed around I/O pads and with a large layout area for the sufficient ESD performance and capability of driving signal.

As the IC dimension shrinking in advanced technology, the layout design of ESD and OCD is more difficult due to layout area limited. Therefore, how to reduce the layout area while effectively protecting internal circuits is an important issue in this field.

SUMMARY

One aspect of the present disclosure is an off chip driver structure includes a plurality of pull-up transistors, a plurality of pull-down transistors, a plurality of first regions of a first type, a plurality of second regions of a second type and a plurality of resistor components. The first regions and the second regions are staggered to form an electrostatic discharge (ESD) component. One of the resistor components is coupled to one of the pull-up transistors or one of the pull-down transistors, the resistor components are arranged between the first regions and the second regions.

BRIEF DESCRIPTION OF THE DRAWINGS

FIGS. 6A-6D are schematic diagrams illustrating resistor components in accordance with some embodiments of the disclosure.

DETAILED DESCRIPTION

The following embodiments are disclosed with accompanying diagrams for detailed description. For illustration clarity, many details of practice are explained in the following descriptions. However, it should be understood that these details of practice do not intend to limit the present disclosure. That is, these details of practice are not necessary in parts of embodiments of the present disclosure. Furthermore, for simplifying the diagrams, some of the conventional structures and elements are shown with schematic illustrations.

The terms used in this specification and claims, unless otherwise stated, generally have their ordinary meanings in the art, within the context of the disclosure, and in the specific context where each term is used. Certain terms that are used to describe the disclosure are discussed below, or elsewhere in the specification, to provide additional guidance to the practitioner skilled in the art regarding the description of the disclosure.

It will be understood that, although the terms "first," "second," etc., may be used herein to describe various elements, these elements should not be limited by these terms. These terms are used to distinguish one element from another. For example, a first element could be termed a second element, and, similarly, a second element could be termed a first element, without departing from the scope of the embodiments.

In this document, the term "coupled" may also be termed "electrically coupled," and the term "connected" may be termed "electrically connected." "Coupled" and "connected" may also be used to indicate that two or more elements cooperate or interact with each other.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

Figure 1:
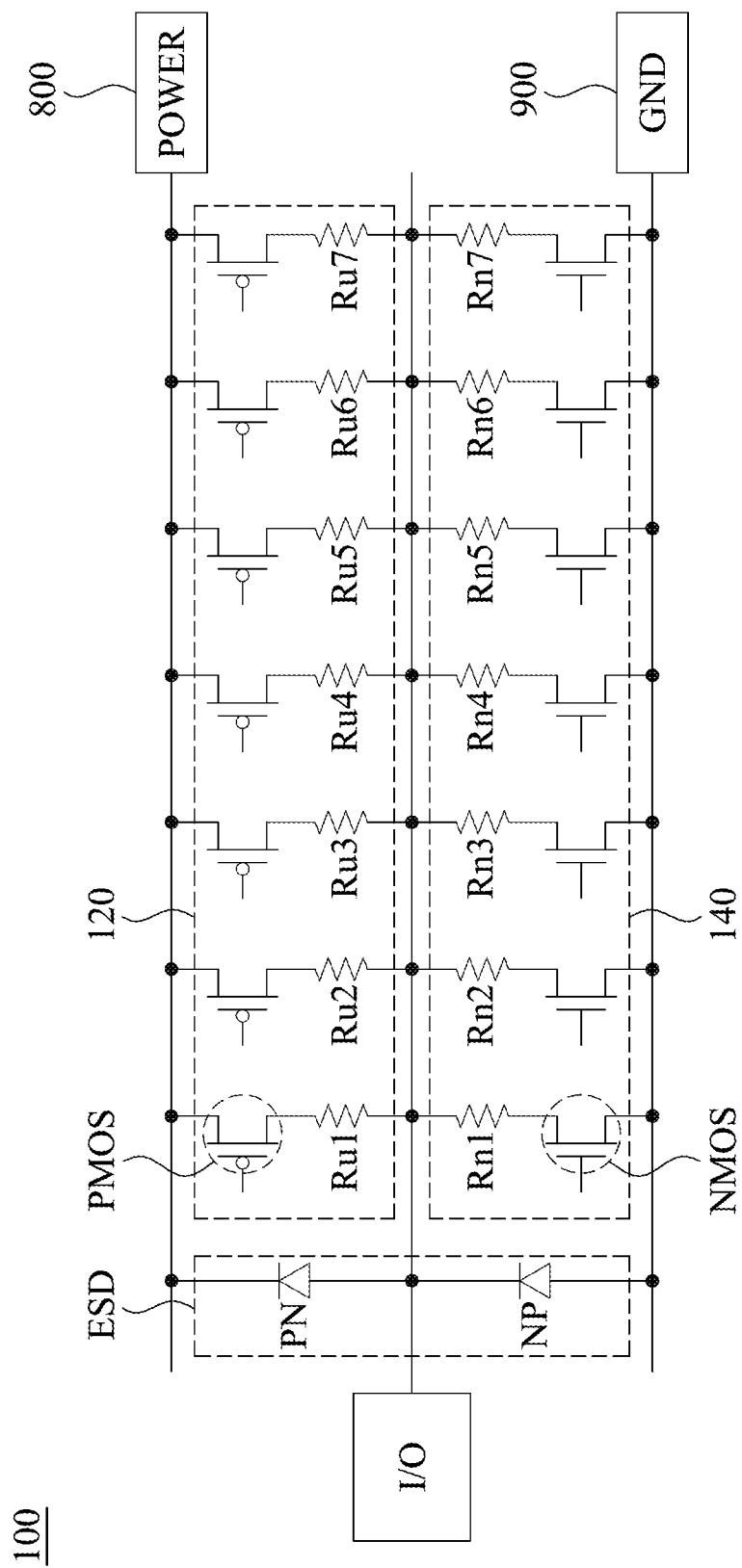
FIG. 1 is a schematic diagram illustrating an off chip driver circuit in accordance with some embodiments of the disclosure.

Please refer to FIG. 1. FIG. 1 is a schematic diagram illustrating an off chip driver circuit 100 in accordance with some embodiments of the disclosure. As shown in FIG. 1, the off chip driver (OCD) circuit 100 includes a pull-up circuit 120, a pull-down circuit 140 and an electrostatic discharge (ESD) circuit. The ESD circuit includes an ESD diode PN and an ESD diode NP. The pull-up circuit 120 includes a plurality of first transistors (e.g., the first transistor PMOS shown in FIG. 1) and a plurality of resistors (e.g., the resistors Ru1~Ru7). The pull-down circuit 140 includes a plurality of second transistors (e.g., the second transistor NMOS shown in FIG. 1) and a plurality of resistors (e.g., the resistors Rn1~Rn7).

A plurality of first terminals of the first transistors are coupled to a power source 800 and configured to receive a first voltage POWER. A plurality of second terminals of the first transistors are coupled to one terminals of the resistors Ru1~Ru7 respectively. The other terminals of the resistors Ru1~Ru7 are coupled to an input/output pad I/O.

Similarly, a plurality of first terminals of the second transistors are coupled to a ground 900 and configured to receive a second voltage GND. A plurality of second terminals of the second transistors are coupled to one terminals of the resistors Rn1~Rn7 respectively. The other terminals of the resistors Rn1~Rn7 are coupled to the input/output pad I/O.

The ESD diode PN and the pull-up circuit 120 are connected in parallel. The ESD diode NP and the pull-down circuit 140 are connected in parallel. Specifically, the n-junction of the ESD diode PN is coupled to the power source 800 and configured to receive the first voltage POWER. The p-junction of the ESD diode PN and the n-junction of the ESD diode NP are coupled to the input/output pad I/O. The p-junction of the ESD diode NP is coupled to the ground 900 and configured to receive the second voltage GND.

It should be noted that seven first transistors, seven second transistors and fourteen resistors illustrated in FIG. 1 are merely examples, not intended to limit the present disclosure. Those skilled in the art may adjust the number of the transistors and the resistors based on actual needs.

Figure 2:
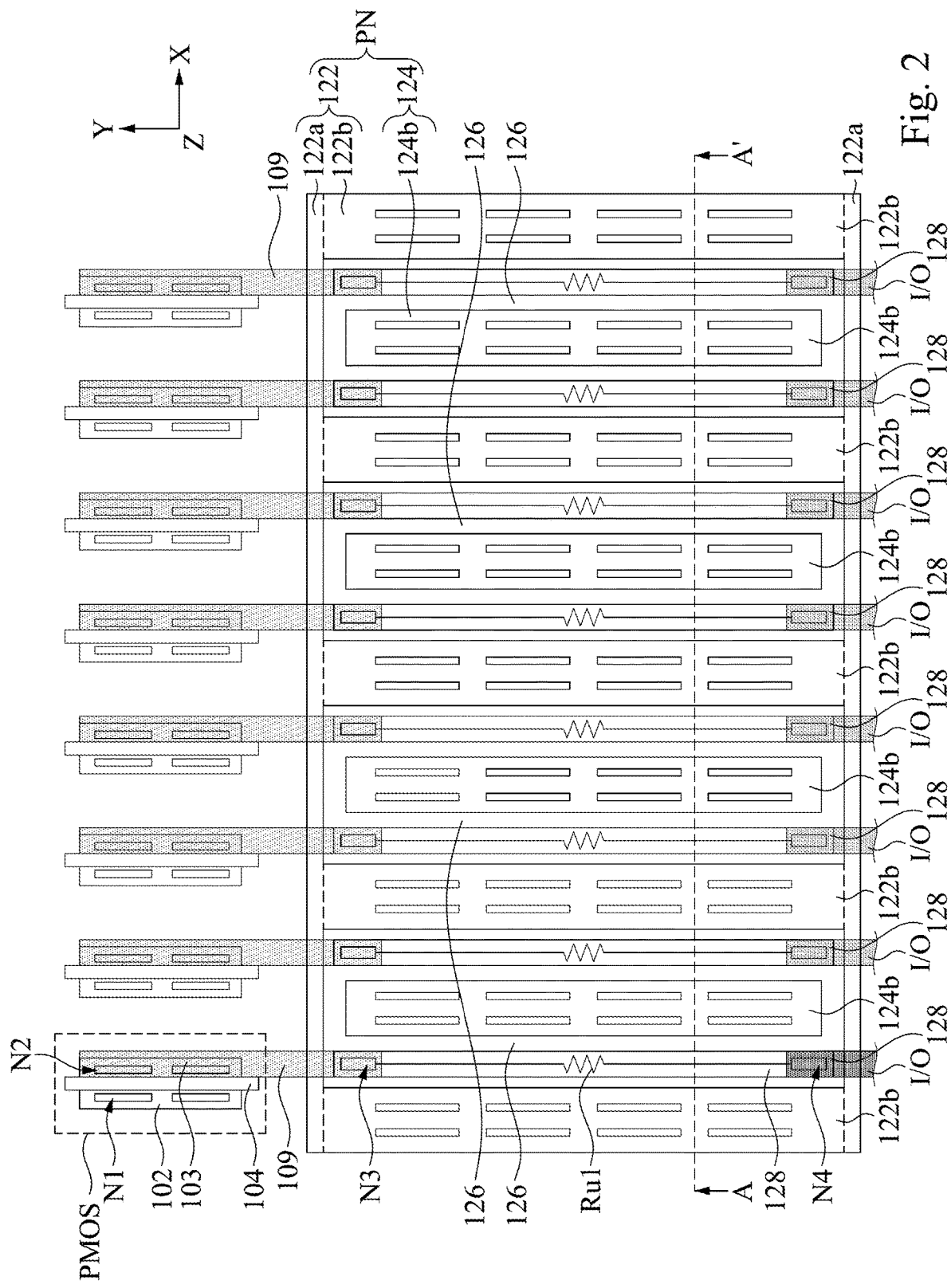
FIG. 2 is a schematic diagram illustrating a pull-up circuit with an ESD diode in accordance with some embodiments of the disclosure.
Figure 3:
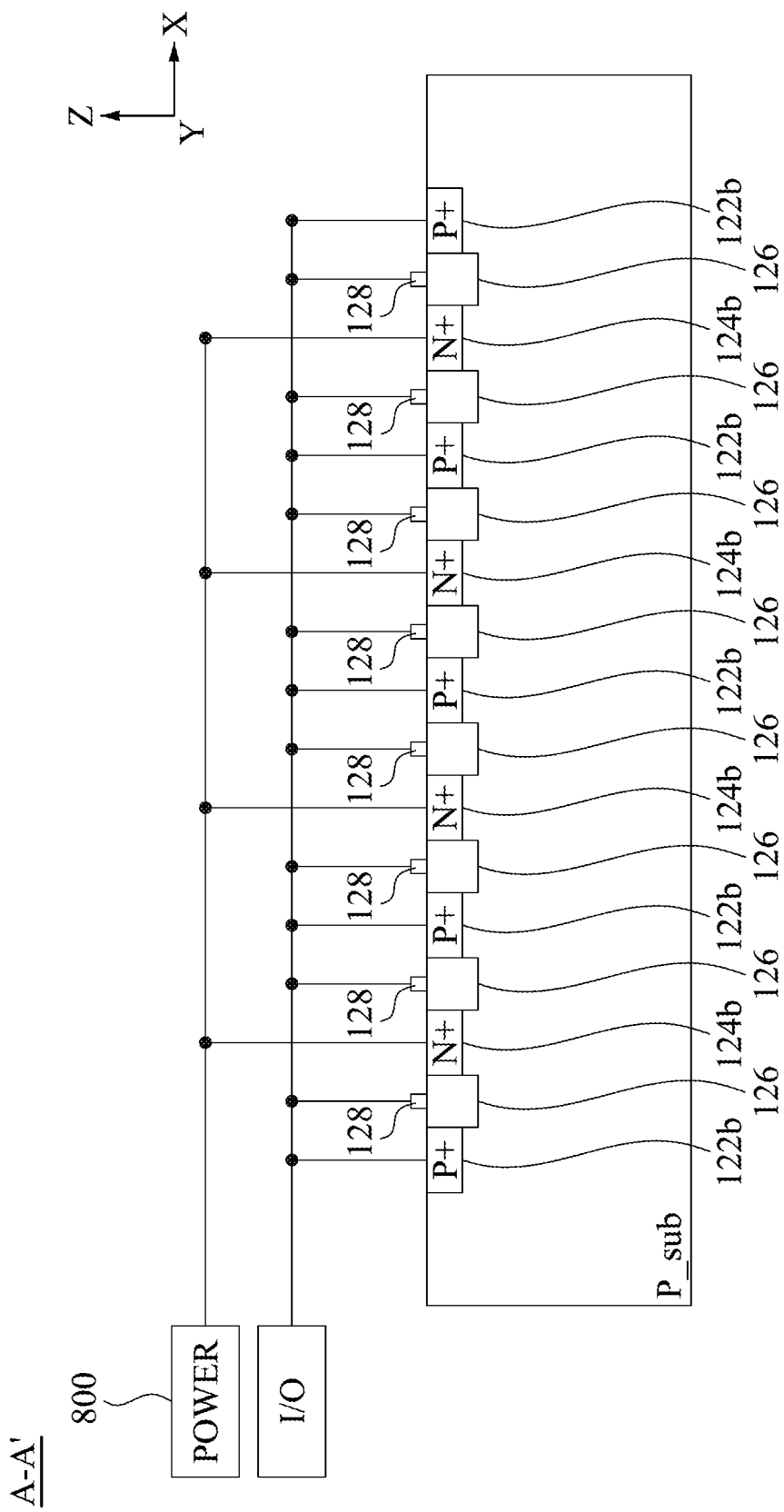
FIG. 3 is a cross-sectional view illustrating the ESD diode in accordance with some embodiments of FIG. 2.

Please refer to FIG. 2 and FIG. 3 together. FIG. 2 is a schematic diagram illustrating a pull-up circuit 120 with an ESD diode PN in accordance with some embodiments of the disclosure. FIG. 3 is a cross-sectional view illustrating the ESD diode PN in accordance with some embodiments of FIG. 2. For the convenience and clarity of explanation, the first transistor PMOS is indicated as a representative among the plurality of first transistors. Similarly, the resistor Ru1 is indicated as a representative among the resistors Ru1-Ru7.

As shown in FIG. 2, the first transistor PMOS is composed of active areas 102, 103 and gate 104. The resistor Ru1 is composed of a resistor component 128. The ESD diode PN is composed of a plurality of first regions of a first type (i.e., p-doping region 122) and a plurality of second regions of a second type (i.e., n-doping region 124). In other words, in some embodiments, the first type is a p-type and the second type is an n-type.

It should be note that throughout the description, the p-type or p-doping region is a region doped with trivalent impurities, for example but not limited to, boron (B), aluminum (Al), and gallium (Ga), as is known in the art of semiconductor manufacturing. Besides, the n-type or n-doping region is a region doped with pentavalent impurities, for example but not limited to, phosphorus (P), arsenic (As), and antimony (Sb), as is known in the art of semiconductor manufacturing.

In some embodiments, the gate 104 is arranged above and across the active area 102 and the active area 103. The active area 102 is disposed at a first side of the gate 104, and the active area 103 is disposed at a second side of the gate 104. The active area 102 is configured to receive the first voltage POWER. The active area 103 is coupled to the resistor component 128, and the resistor component 128 is coupled to the input/output pad I/O.

Specifically, the active area 102 is coupled to the power source 800 (not shown in FIG. 2) through a mental contact N1. The active area 103 is coupled to a connective line 109 through a mental contact N2. The resistor component 128 is coupled to the connective line 109 through a mental contact N3. The resistor component 128 is coupled to the input/output pad I/O through a mental contact N4.

In this way, by connecting the resistor component 128 to the active area 103 and the input/output pad I/O, the resistor component 128 is able to realize the resistor Ru1 connected to first transistor PMOS and the input/output pad I/O.

As shown in FIG. 2, the ESD diode PN is composed by the p-doping region 122 and the n-doping region 124. In some embodiments, the p-doping region 122 is composed by a pair of side p-doping areas 122a and a plurality of stripe areas 122b. The n-doping region 124 is composed by a plurality of stripe areas 124b.

In structure, as shown in FIG. 2, the pair of side p-doping areas 122a is a pair of slender stripes and extends in the X direction. The stripe areas 122b and the stripe areas 124b extend in the Y direction and are sandwiched by the pair of side p-doping areas 122a. In addition, in the X direction, the stripe areas 122b and the stripe areas 124b are arranged in an alternating manner.

In some embodiments, a plurality of shallow trench isolations (STI) 126 are connected between the stripe areas 122b and the stripe areas 124b. In other words, the stripe areas 124b are surrounded by the STIs 126, and the STIs 126 are surrounded by the stripe areas 122b and side p-doping areas 122a (i.e., p-doping region 122).

Explain in a different way, as shown in FIG. 3, the stripe areas 122b, the stripe areas 124b and the STIs 126 are disposed at a p-type substrate P_sub, and the resistor components 128 are arranged on the STIs 126. In other words, the stripe areas 122b, the stripe areas 124b and the STIs 126 are arranged in a first layer, and the resistor components 128 are arranged in a second layer different from the first layer. For example, the resistor components 128 may be arranged in a first mental layer, a second mental layer and/or a third mental layer.

Furthermore, as shown in FIG. 3, the stripe areas 122b and stripe areas 124b are arranged in an alternating manner in the X direction. In other words, each of the stripe areas 122b and stripe areas 124b is sandwiched by the STIs 126 in the X direction, and each of the STIs 126 is sandwiched by one of the stripe areas 122b and one of the stripe areas 124b in the X direction.

In this way, the resistor component 128 may be arranged within the layout area of the ESD diode PN. Therefore, the resistors Ru1-Ru7 as shown in FIG. 1 do not need to occupy additional layout area. That is, in the same size of the layout area of the ESD diode PN, the ESD diode PN and the resistor component 128 may be arranged.

Figure 4:
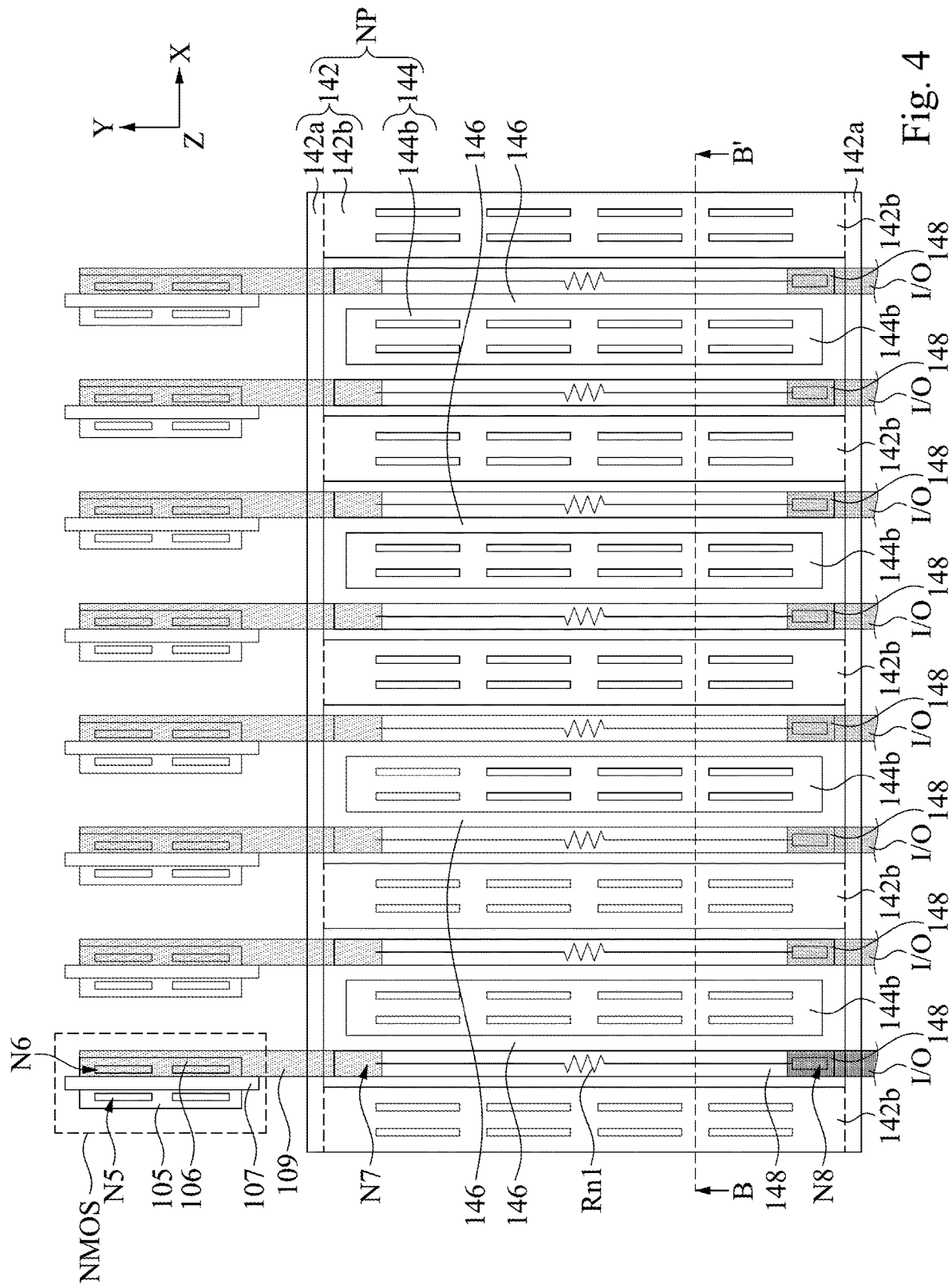
FIG. 4 is a schematic diagram illustrating a pull-down circuit with an ESD diode in accordance with some embodiments of the disclosure.
Figure 5:
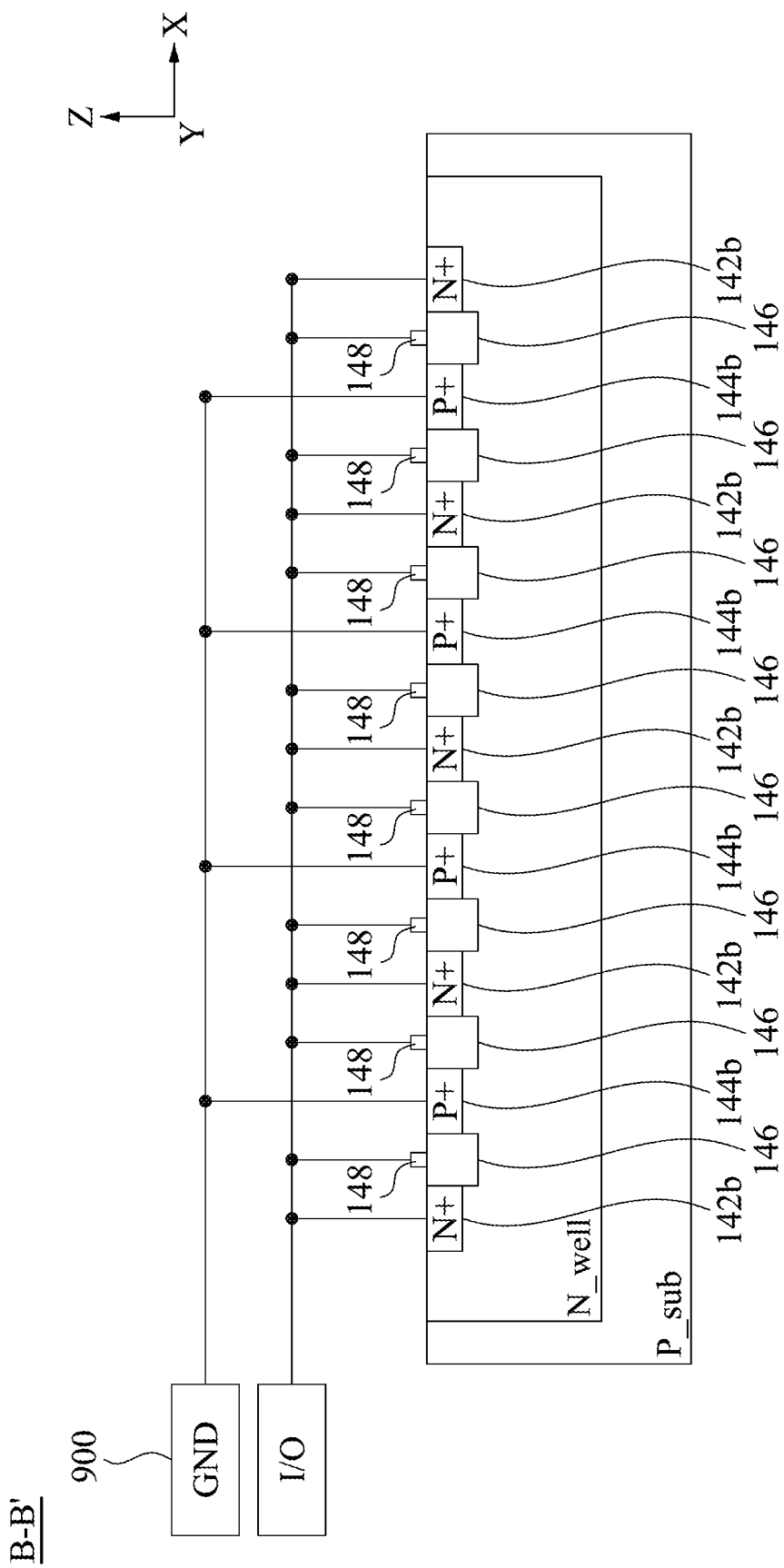
FIG. 5 is a cross-sectional view illustrating the ESD diode in accordance with some embodiments of FIG. 4.

Please refer to FIG. 4 and FIG. 5 together. FIG. 4 is a schematic diagram illustrating a pull-down circuit 140 with an ESD diode NP in accordance with some embodiments of the disclosure. FIG. 5 is a cross-sectional view illustrating the ESD diode NP in accordance with some embodiments of FIG. 4. For the convenience and clarity of explanation, the second transistor NMOS is indicated as a representative among the plurality of second transistors. Similarly, the resistor Rn1 is indicated as a representative among the resistors Rn1~Rn7.

As shown in FIG. 4, the second transistor NMOS is composed of active areas 105, 106 and gate 107. The resistor Rn1 is composed of a resistor component 148. The ESD diode NP is composed of a plurality of first regions of the first type (i.e., p-doping region 144) and a plurality of second regions of the second type (i.e., n-doping region 142).

In some embodiments, the gate 107 is arranged above and across the active area 105 and the active area 106. The active area 105 is disposed at a first side of the gate 107, and the active area 106 is disposed at a second side of the gate 107. The active area 105 is configured to receive the second voltage GND. The active area 106 is coupled to the resistor component 148, and the resistor component 148 is coupled to the input/output pad I/O.

Specifically, the active area 105 is coupled to the ground 900 (not shown in FIG. 4) through a mental contact N5. The active area 106 is coupled to the connective line 109 through a mental contact N6. The resistor component 148 is coupled to the connective line 109 through a mental contact N7. The resistor component 148 is coupled to the input/output pad I/O through a mental contact N8.

In this way, by connecting the resistor component 148 to the active area 106 and the input/output pad I/O, the resistor component 148 is able to realize the resistor Rn1 connected to second transistor NMOS and the input/output pad I/O.

As shown in FIG. 4, the ESD diode NP is composed of the n-doping region 142 and the p-doping region 144. In some embodiments, the n-doping region 142 is composed of a pair of side n-doping areas 142a and a plurality of stripe areas 142b. The p-doping region 144 is composed of a plurality of stripe areas 144b. As shown in FIG. 4, the pair of side n-doping areas 142a is a pair of slender stripes and extends in the X direction. The stripe areas 142b and the stripe areas 144b extend in the Y direction and are sandwiched by the pair of side n-doping areas 142a. In addition, in the X direction, the stripe areas 142b and the stripe areas 144b are arranged in an alternating manner.

In some embodiments, a plurality of shallow trench isolations (STI) 146 are connected between the stripe areas 142b and the stripe areas 144b. In other words, the stripe areas 144b are surrounded by the STIs 146, and the STIs 146 are surrounded by the stripe areas 142b and side n-doping areas 142a (i.e., n-doping region 142).

Explain in a different way, as shown in FIG. 5, the stripe areas 142b, the stripe areas 144b and the STIs 146 are disposed at an n-type well N_well disposed at a p-type substrate P_sub, and the resistor components 148 are arranged on the STIs 146. In other words, the stripe areas 142b, the stripe areas 144b and the STIs 146 are arranged in the first layer, and the components 148 are arranged in the second layer different from the first layer. For example, the components 148 may be arranged in the first mental layer, the second mental layer and/or the third mental layer.

Furthermore, as shown in FIG. 5, the stripe areas 142b and stripe areas 144b are arranged in an alternating manner in the X direction. In other words, each of the stripe areas 142b and stripe areas 144b is sandwiched by the STIs 146 in the X direction, and each of the STIs 146 is sandwiched by one of the stripe areas 142b and one of the stripe areas 144b in the X direction.

In this way, the resistor component 148 may be arranged within the layout area of the ESD diode NP. Therefore, the resistors Rn1-Rn7 as shown in FIG. 1 do not need to occupy additional layout area. That is, in the same size of the layout area of the ESD diode NP, the ESD diode NP and the resistor component 148 may be arranged.

About the details of the resistor components 128 and 148, please refer to FIGS. 6A~6D. FIGS. 6A~6D are schematic diagrams illustrating resistor components R1~R4 in accordance with some embodiments of the disclosure. In some embodiments, the resistors Ru1~Ru7 and Rn1~Rn7 shown in FIG. 1 may be realized by the resistor components R1~R4 shown in FIGS. 6A~6D. As shown in FIG. 6A, the resistor component R1 is composed of four portions U1~U4. Similarly, as shown in FIGS. 6B~6D, the resistor components R2, R3 and R4 are composed of three portions U1~U3, two portions U1~U2 and one portion U1, respectively. In some embodiments, each of the portions U1~U4 may be polysilicon. In some other embodiments, each of the portions U1~U4 may be metal. Due to the different conductivity of different materials, the resistance value of each resistor is adjustable according to a length ratio of polysilicon and metal of the resistor component. For example, if the portions U1~U4 are polysilicon connected by electrical conductor, and the resistance value of the resistor component R1 is 4/4R, then the resistance values of the resistor components R2, R3 and R4 are 3/4R, 2/4R and 1/4R respectively. In other words, as the length of polysilicon of the resistor component is longer, the resistance value of the resistor component is larger.

It should be noted that four portions and their lengths illustrated in figures are merely examples, not intended to limit the present disclosure. Those skilled in the art may adjust the number of the portions, their lengths and the ration of different materials based on actual needs.

It is noted that, the drawings, the embodiments, and the features and circuits in the various embodiments may be combined with each other as long as no contradiction appears. The circuits illustrated in the drawings are merely examples and simplified for the simplicity and the ease of understanding, but not meant to limit the present disclosure. In addition, those skilled in the art can understand that in various embodiments, circuit units may be implemented by different types of analog or digital circuits or by different chips having integrated circuits. Components may also be integrated in a single chip having integrated circuits. The description above is merely by examples and not meant to limit the present disclosure.

In summary, in various embodiments of the present disclosure, by disposing the resistor components between the p-doping and n-doping areas of the ESD diodes, the overall layout area of the off chip driver circuit may be reduced.

Although specific embodiments of the disclosure have been disclosed with reference to the above embodiments, these embodiments are not intended to limit the disclosure. Various alterations and modifications may be performed on the disclosure by those of ordinary skills in the art without departing from the principle and spirit of the disclosure. Thus, the protective scope of the disclosure shall be defined by the appended claims.

What is claimed is:

1. A circuit structure, comprising:
   an input/output pad;
   a plurality of pull-up transistors connected to a first voltage;
   a plurality of pull-down transistors connected to a second voltage;
   an electrostatic discharge (ESD) diode comprising a plurality of first regions of a p-type and a plurality of second regions of an n-type,
   wherein the first regions and the second regions are arranged in an alternating manner, and one of the first regions and one of the second regions form a component of the ESD diode;
   a plurality of first resistor components having a plurality of first terminals connected to the plurality of pull-up transistors and a plurality of second terminals connected to the input/output pad; and
   a plurality of second resistor components having a plurality of third terminals connected to the plurality of pull-down transistors and a plurality of fourth terminals connected to the input/output pad, wherein each one of the plurality of first resistor components and each one of the plurality of second resistor components are arranged between one of the first regions and one of the second regions.

2. The circuit structure of claim 1, wherein the resistor components are composed of polysilicon or metal.

3. The circuit structure of claim 1, wherein the resistor components are composed of polysilicon and metal, the resistance value of each resistor component is dependent on a length of the each resistor component.

4. The circuit structure of claim 1, further comprising:
   a plurality of shallow trench isolations (STI), arranged between the first regions and the second regions, wherein the resistor components are arranged on the STIs.

5. The circuit structure of claim 4, wherein the first regions, the second regions and the STIs are arranged in a first layer, the resistor components are arranged in a second layer different from the first layer.

6. The circuit structure of claim 4, wherein the first regions, the second regions, the STIs and the resistor components are parallel stripes extending in a first direction.

7. The circuit structure of claim 6, wherein the first regions and the second regions are arranged in an alternating manner in a second direction different from the first direction.

8. The circuit structure of claim 6, wherein each of the first regions and the second regions is sandwiched by the STIs in a second direction different from the first direction.

9. The circuit structure of claim 6, wherein each of the STIs is sandwiched by one of the first regions and one of the second regions in a second direction different from the first direction.

10. The circuit structure of claim 1, wherein the resistor components coupled to the pull-up transistors are arranged between the second regions configured to receive the first voltage and the first regions coupled to a pad, the resistor components coupled to the pull-down transistors are arranged between the first regions configured to receive the second voltage and the second regions coupled to the pad.

* * * * *